United States Patent [19]
Lee

[11] Patent Number: 5,880,992
[45] Date of Patent: Mar. 9, 1999

[54] ELECTRICALLY ERASABLE AND PROGRAMMABLE READ ONLY MEMORY

[75] Inventor: Chang-Ho Lee, Kyunggi-do, Rep. of Korea

[73] Assignee: SamSung Electronics Co., Ltd., Suwon, Rep. of Korea

[21] Appl. No.: 1,669

[22] Filed: Dec. 31, 1997

[30] Foreign Application Priority Data

Jan. 4, 1997 [KR] Rep. of Korea ............... 1997 69

[51] Int. Cl.[6] ............................................. G11C 7/00
[52] U.S. Cl. .................. 365/185.04; 365/195; 365/233
[58] Field of Search ..................... 365/185.02, 185.04, 365/195, 196, 233, 228

[56] References Cited

U.S. PATENT DOCUMENTS

| | | | |
|---|---|---|---|
| 4,412,309 | 10/1983 | Kuo | 365/184 |
| 4,412,310 | 10/1983 | Korsh et al. | 365/185 |
| 5,097,445 | 3/1992 | Yamauchi | 365/195 |
| 5,204,839 | 4/1993 | Lee et al. | 365/204 |
| 5,363,334 | 11/1994 | Alexander et al. | 365/185.04 |
| 5,381,366 | 1/1995 | Kawauchi et al. | 365/185.04 |
| 5,455,800 | 10/1995 | Wells et al. | 365/218 |
| 5,457,652 | 10/1995 | Brahmbhatt | 365/185.06 |
| 5,559,992 | 9/1996 | Stutz et al. | 395/490 |
| 5,602,775 | 2/1997 | Vo | 365/185.01 |
| 5,615,151 | 3/1997 | Furuno et al. | 365/185.18 |
| 5,696,717 | 12/1997 | Koh | 365/185.22 |
| 5,749,088 | 5/1998 | Brown et al. | 711/115 |

*Primary Examiner*—Son Mai
*Attorney, Agent, or Firm*—Robert E. Bushnell, Esq.

[57] ABSTRACT

An electrically erasable and programmable read only memory (EEPROM) device is disclosed. The EEPROM device includes a memory array coupled to an address bus and a data bus; a register located in a predetermined memory area of the EEPROM device for latching a data bit from the data bus when the address of the register is selected, in which the data bit functions as program enable or disable signal; and means for setting program enable or disable state of the EEPROM device in response to input of the output signal of the register and write enable signal. The register consists of a D-flip flop which has a clock input connected with the write enable signal, and the program enable or disable state setting means includes an OR gate. With this, simple configuration of the system Input/Output address is possible. This invention also effectively interrupts the write enable signal ($\overline{WE}$) supplied with the EEPROM memory block after the data input is completed. Thus, loss of data in the memory block is effectively prevented.

11 Claims, 3 Drawing Sheets

5,880,992

ELECTRICALLY ERASABLE AND PROGRAMMABLE READ ONLY MEMORY

CLAIM OF PRIORITY

This application makes reference to, incorporates the same herein, and claims all benefits accruing under 35 U.S.C. §119 from an application for An Electrically Erasable and Programmable Read Only Memory earlier filed in the Korean Industrial Property Office on 4 Jan. 1997 and there duly assigned Ser. No. 69/1997

FIELD OF THE INVENTION

The present invention relates to a semiconductor memory device, and more particularly to an electrically erasable and programmable read only memory (EEPROM) device which omits a program voltage supply circuit for programming the EEPROM.

BACKGROUND OF THE INVENTION

EEPROM memory devices are advantageous in re-programming the memory since it uses a supply voltage to erase the data stored therein instead of exposing it to the ultraviolet rays. In particular, a part of the memory area can be selectively erased and thus partial changing of data stored in the EEPROM is possible. Once the data is erased, rewriting of data is performed by applying a program voltage, commonly of high potential, to the program voltage input of the EEPROM chip.

For several bytes capacity EEPROM devices, it is used for example in storing a default setup data of ASIC (Application Specific Integrated Circuit) device. The stored data is transferred to or from the SERIAL DATA IN/OUT pin, in synchronization with clock signals applied with the EEPROM device. Further, some Megabyte capacity EEPROM device is used in storing a firmware of a system.

U.S. Pat. No 5,615,151 for a Semiconductor Integrated Circuit Operable And Programmable At Multiple Voltage Levels to Furuno et al discloses an EPROM programmable at a wide range of voltages. However the circuit is complex and requires numerous components to construct. I have not seen a circuit that eliminates the need for a separate program supply voltage that requires relatively few components.

SUMMARY OF THE INVENTION

It is therefore an object of the invention to provide a simple circuit for an electrically erasable and programmable read only memory (EEPROM) device which can omit a program voltage supply circuit for programming the EEPROM.

In accordance with the present invention, there is provided with an EEPROM device using a program voltage and a write enable signal for programming the device, which device comprises a memory array coupled to an address bus and a data bus; a register located in a predetermined memory area of the EEPROM device for latching a data bit from the data bus when the address of the register is selected, in which the data bit functions as program enable or disable signal; and means for setting program enable or disable state of the EEPROM device in response to input of the output signal of the register and write enable signal.

Preferably, the register includes a D-flip flop which has a clock input connected with the write enable signal, and the program enable or disable state setting means includes an OR gate.

Programming of the EEPROM device is performed in a simple way such that a memory address of the register is designated in the memory map of the device. This allows simple configuration of the system Input/Output address. This invention effectively interrupts the write enable signal ($\overline{WE}$) supplied with the EEPROM memory block after the data input is completed. Thus, loss of data in the memory block due to erroneous application of the write enable signal is effectively prevented.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
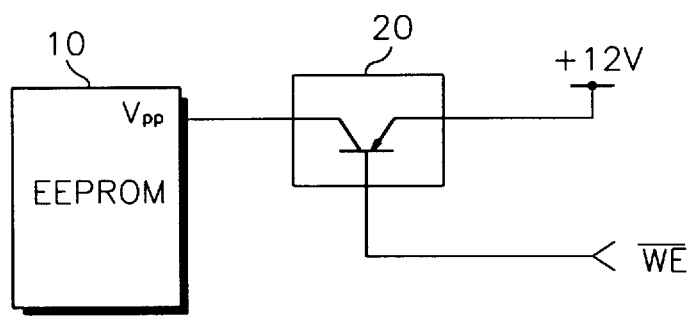
FIG. 1 is a schematic diagram of a conventional program voltage supply circuit used in programming an EEPROM device.

Conventionally, supplying of a program voltage with the EEPROM device is performed by a separate circuit known as a program voltage supply circuit, as shown in FIG. 1. The program voltage, for example +12 Volts is applied with the program voltage pin Vpp of an EEPROM device 10. The voltage supply line is controlled by a switch 20 operable in response to the write enable signal ($\overline{WE}$). When the write enable sign a $\overline{WE}$ is applied with the gate terminal of the switch 20, the +12 Volts program voltage is supplied with the EEPROM device, and thus writing a data into the EEPROM is possible.

The conventional programming method of EEPROM may cause an increase of the cost, as it requires a separate program voltage supply circuit in a system board. Furthermore, a trouble may occur in the program voltage supply circuit, which results in lost of data in the programming procedure of EEPROM device and malfunction of the system. Since there is no remedy for recovering the lost data afterward, the system board should be repaired or discarded.

Figure 2:
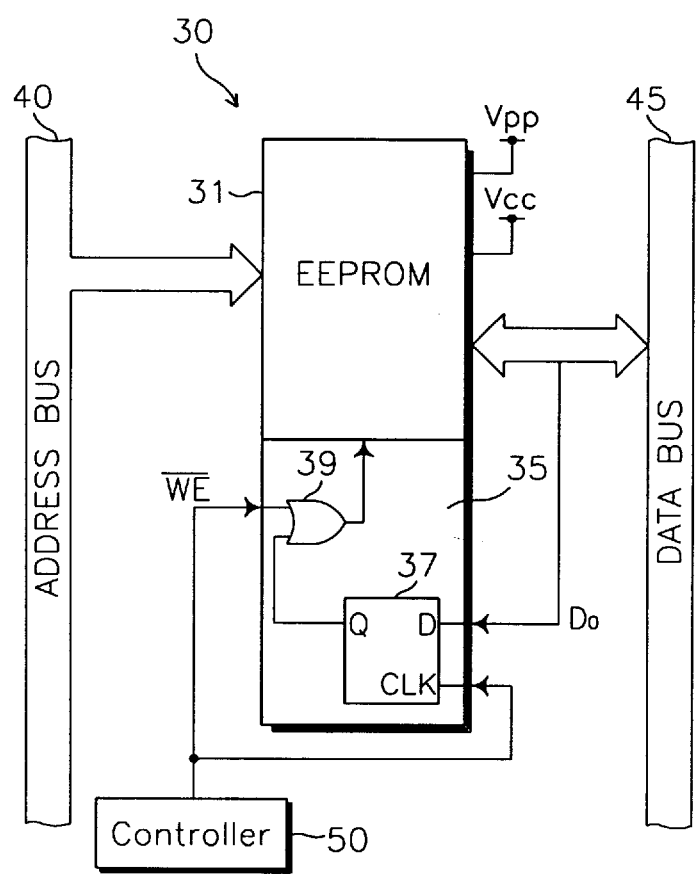
FIG. 2 is a schematic circuit diagram of an EEPROM device configured in accordance with the present invention.

Referring to FIG. 2, there is shown a circuit configuration of an EEPROM device according to the present invention. The EEPROM device 30 includes an EEPROM block 31 having a memory array and its control circuit, and a programming control block 35 having a register 37 and a gate 39. The programming control block 35 is incorporated with the EEPROM block 31 within the EEPROM device 30, in order to carry out the program enable/disable function. Preferably, the register 37 consists of a one-bit latch of D-flip flop, and the gate 39 an OR gate. The EEPROM block 31 has a plurality of pins coupled to an address bus 40 and a data bus 45 to select a data in the memory array and transfer it to a system microcontroller. Also, pins Vpp and Vcc are designated to be applied with a program voltage and an operating voltage, respectively.

In the programming control block 35, D input of the register 37 is connected with one data bit line of the data bus 45, for example least significant bit data $D_0$. And the clock input CLK of the register 37 is connected with a write enable signal ($\overline{WE}$) line provided by a memory controller 50. The write enable signal ($\overline{WE}$) line is also connected with one input of the OR gate 39. Output Q of the register 37 is connected with the other input of the OR gate 39, and the output of the OR gate 39 is coupled with the EEPROM block 31.

The data of the least significant bit $D_0$ is latched in synchronization with the write enable signal ($\overline{WE}$) provided by the memory controller 50. And the output of the register 37 is applied with the EEPROM block 31 through the OR gate 39, to control programming operation of the EEPROM device 30.

Figure 3:
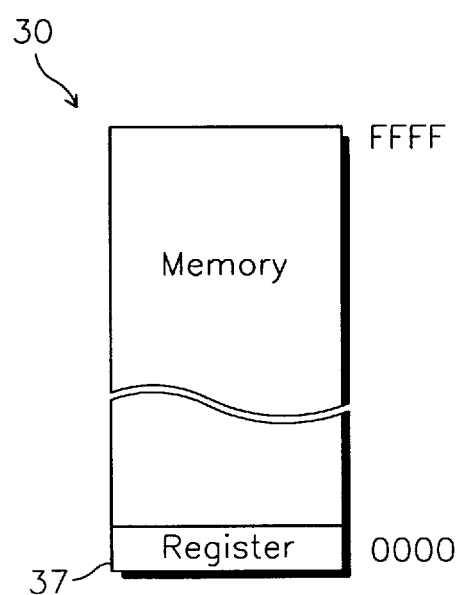
FIG. 3 is a diagram for illustrating a memory map of the EEPROM shown in FIG. 2.
Figure 4:
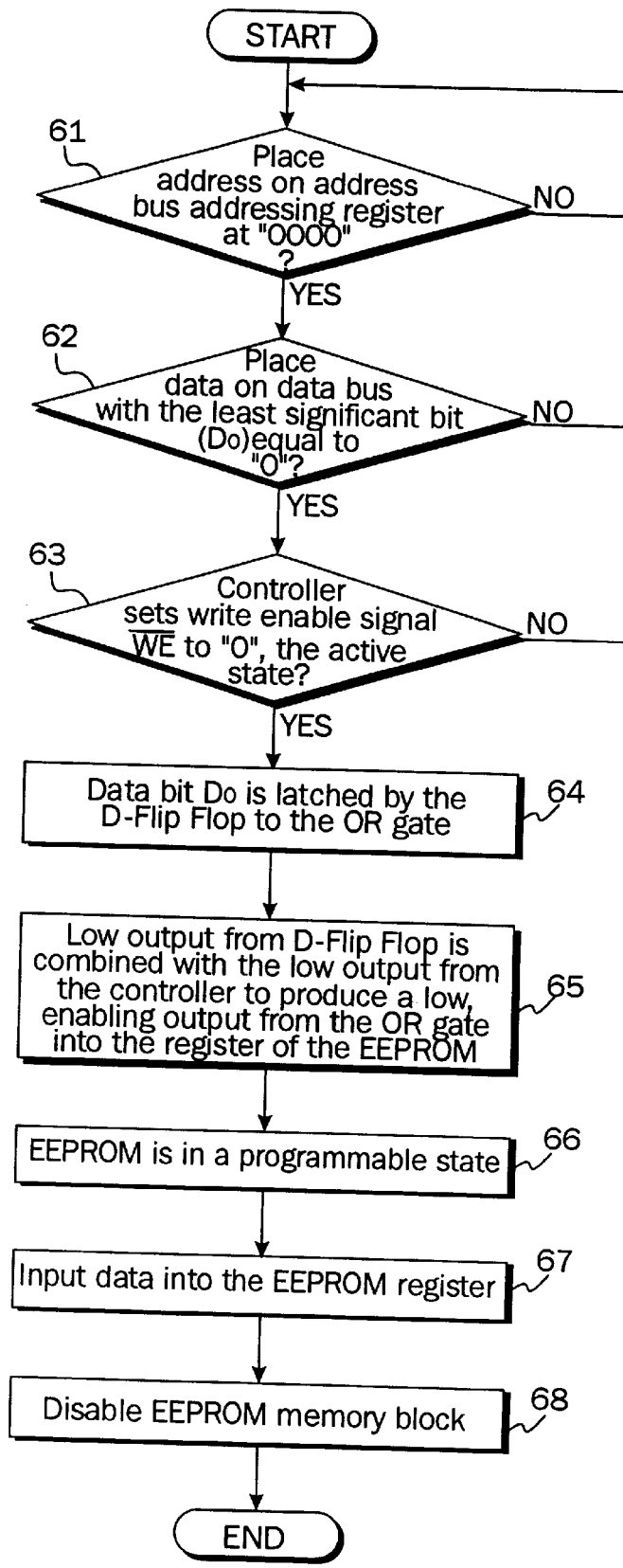
FIG. 4 is a flow chart illustrating the sequence of events that occur in programming the EEPROM of FIG. 2 in accordance with the present invention.

FIG. 4 discloses a flow chart for the programming process of the EEPROM shown in FIG. 2 in accordance with the present invention. In accessing the register 37, an address for the register 37 is assigned at the EEPROM block 31. The address mapped in the memory map is shown in FIG. 3, for example. A memory block having address 0000 is assigned for the register 37. Thus, when programming operation is initiated, an address signal corresponding to 0000 is supplied with the EEPROM block 31 via address bus 40 as in step 61. Then, the least significant bit (LSB) data signal $D_0$ corresponds to '0', for example, is supplied to the EEPROM block 31 via the data bus 45 as in step 62. Upon receiving the write enable signal ($\overline{WE}$) as in step 63, the data '0' is latched in the register 37 and the output is signal '0' supplied to the EEPROM block 31 as in step 64. This signal enables the EEPROM block 31 to be in the programmable state as in steps 65 and 66.

In this embodiment, the program voltage Vpp is set to the same as the operating voltage Vcc, for example +5 Volts. Also, the data signal $D_0$, functions as a program enable signal in the programming control block 35 during the programming procedure. Once inputting of data in the register 37 has completed as in step 67, the program operation of the EEPROM block 31 is disabled as in step 68. Therefore, in normal state, the programming control block 35 of the present invention effectively interrupts the write enable signal ($\overline{WE}$) supplied to the EEPROM memory block 31. Thus, loss of data in the memory block 31 due to erroneous application of the write enable signal is effectively prevented.

According to this invention, enhancing stability of EEPROM devices is possible, by omitting separate program voltage supply circuit for programming the EEPROM. Further, programming of the EEPROM device 30, i.e., writing a data in the memory block 31 can be performed in a simple way by designating a memory address of the register 37 in the EEPROM block 31. This allows a simple configuration of the system Input/Output address map, since an I/O address assigned for programming the EEPROM device 30 is not used.

While the invention has been described in terms of an exemplary embodiment, it is contemplated that it may be practiced as outlined above with modifications within the spirit and scope of the appended claims.

What is claimed is:

1. An electrically erasable and programmable read only memory device using a program voltage and a write enable signal for programming the electrically erasable programmable read only memory device, said device comprising:

a memory array coupled to an address bus and a data bus;

a register located in a predetermined memory area of the electrically erasable programmable read only memory device for latching a data bit from the data bus when the address of the register is selected, wherein the data bit functions as program enable or disable signal; and means for setting program enable or disable state of the electrically erasable programmable read only memory device in response to input of the output signal of the register and said write enable signal.

2. The electrically erasable programmable read only memory device as set forth in claim 1, wherein the register includes a D-flip flop which has a clock input connected with the write enable signal.

3. The electrically erasable programmable read only memory device as set forth in claim 1, wherein the program enable or disable state setting means includes an OR gate.

4. The electrically erasable programmable read only memory device as set forth in claim 1, wherein the program voltage supplied with the memory array is set to the same as the operating voltage of the electrically erasable programmable read only memory device.

5. An electronic circuit for enabling an electrically erasable programmable read only memory, comprising:

a controller that outputs an inverted write enable signal;

a data bus containing a plurality of data bit signals including a least significant bit;

a D flip flop having an input terminal, an output terminal, and a clock terminal; and an OR gate having a first and a second input signal and an output signal, wherein one of said plurality of data bit signals is connected to said input of said D flip flop, said write enable signal is connected to said clock terminal of said D flip flop and a first of said inputs of said OR gate, said output of said D flip flop is connected to said second of said inputs of said OR gate, and said output of said OR gate enables or disables said electrically erasable programmable read only memory.

6. The electronic circuit of claim 5, said least significant bit being connected to said input of said D flip flop.

7. The electronic circuit of claim 6, said D flip flop, said OR gate, said electrically erasable programmable read only memory, and said controller are powered by a +5 volt power supply.

8. The electronic circuit of claim 7, said electronic circuit operates in the absence of a voltage supply other than a +5 volt supply.

9. An electronic circuit for accessing memory in an electrically erasable programmable read only memory, comprising:

an address bus connected to said electrically erasable programmable read only memory;

a data bus connected to said electrically erasable programmable read only memory, said data bus containing a plurality of data bits including a least significant data bit;

an OR gate having a first input and a second input and an output, said output connected to an enabling pin on said electrically erasable programmable read only memory for allowing writing to said electrically erasable programmable read only memory;

a D flip flop having an input terminal, an output terminal, and a clock terminal, said output of said D flip flop being connected to said first input of said OR gate, one of said plurality of data bits being connected to said input of said D flip flop; and a controller outputting a write signal that is active low, said write signal being connected to both said clock input of said D flip flop and said second input of said OR gate.

10. The electronic circuit of claim 9, said least significant bit of said data bus being connected to said input of said D flip flop.

11. The electronic circuit of claim 10, said circuit being powered by a single voltage source.

* * * * *